(12) United States Patent
Ogiso et al.

(10) Patent No.: US 7,344,654 B2
(45) Date of Patent: Mar. 18, 2008

(54) PIEZOELECTRIC CERAMIC COMPOSITION AND PIEZOELECTRIC ACTUATOR

(75) Inventors: Koji Ogiso, Moriyama (JP); Atsushi Yamamoto, Yasu (JP); Koichi Hayashi, Kusatsu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 11/767,313

(22) Filed: Jun. 22, 2007

(65) Prior Publication Data

US 2007/0252484 A1 Nov. 1, 2007

Related U.S. Application Data

(63) Continuation of application No. PCT/JP2005/002162, filed on Nov. 18, 2005.

(30) Foreign Application Priority Data

Dec. 22, 2004 (JP) ............................. 2004-372236

(51) Int. Cl.
C04B 35/493 (2006.01)
H01L 41/187 (2006.01)

(52) U.S. Cl. ............................. 252/62.9 PZ; 501/134; 501/135; 310/311; 310/363; 310/366

(58) Field of Classification Search ......... 252/62.9 PZ; 501/134, 135; 310/311, 363, 366
See application file for complete search history.

(56) References Cited

U.S. PATENT DOCUMENTS

2004/0021399 A1 2/2004 Ogawa et al.

2004/0072670 A1 4/2004 Kasukawa et al.

FOREIGN PATENT DOCUMENTS

| JP | 60-103079 | 6/1985 |
|---|---|---|
| JP | 2-258662 | 10/1990 |
| JP | 5-058729 | 3/1993 |
| JP | 11-322422 | 11/1999 |
| JP | 2002-226266 | 8/2002 |
| JP | 2003-335579 | 11/2003 |

OTHER PUBLICATIONS

International Search Report and Written Opinion of the International Searching Authority dated Feb. 14, 2006.

*Primary Examiner*—C. Melissa Koslow
(74) *Attorney, Agent, or Firm*—Dickstein Shapiro LLP

(57) ABSTRACT

A piezoelectric ceramic composition has the composition formula $(Pb_{(a-b)}Me_b)\{(Ni_{(1-c)/3}Zn_{c/3}Nb_{2d/3})_zTi_xZr_{(1-x-z)}\}O_3$, wherein Me represents at least one element selected from the group consisting of Ba, Sr and Ca; a, b, d, and x satisfy the inequalities $0.975 \leq a \leq 0.998$, $0 \leq b \leq 0.05$, $1 < d \leq 1.3$, and $0.39 \leq x \leq 0.47$; and c and z are located in a region surrounded by lines connecting Point A ($z=0.25$, $c=0.1$), Point B ($z=0.25$, $c=0.85$), Point C ($z=0.1$, $c=0.6$), Point D ($z=0.075$, $c=0.5$), Point E ($z=0.05$, $c=0.2$), and Point F ($z=0.05$, $c=0.1$) or located on the lines in the z-c plane. Therefore, the piezoelectric ceramic composition is effective in achieving a large piezoelectric constant, a small dielectric constant, and a high Curie point. A piezoelectric actuator contains the piezoelectric ceramic composition.

12 Claims, 1 Drawing Sheet

US 7,344,654 B2

PIEZOELECTRIC CERAMIC COMPOSITION AND PIEZOELECTRIC ACTUATOR

This is a continuation of application Ser. No. PCT/JP2005/02162, filed Nov. 18, 2005.

TECHNICAL FIELD

The present invention relates to complex perovskite-type piezoelectric ceramic compositions prepared by doping Pb(Ti, Zr)O$_3$ with Pb(Ni, Nb)O$_3$ and/or Pb(Zn, Nb)O$_3$ etc. The present invention particularly relates to a piezoelectric ceramic composition suitable for piezoelectric actuators and a piezoelectric actuator.

BACKGROUND ART

Piezoelectric ceramic compositions principally containing lead zirconate titanate (Pb(Ti, Zr)O$_3$, hereinafter referred to as "PZT") have excellent piezoelectric properties and therefore are widely used for piezoelectric devices such as piezoelectric actuators.

In order to create large distortions, piezoelectric materials used for piezoelectric actuators need to have a large piezoelectric constant. Piezoelectric devices operated with high voltages are subject to increased temperature because of heat generation during operation. An increase in the dielectric constant of a piezoelectric material increases the amount of heat generated from a device made thereof. This is because the increase of the dielectric constant leads to an increase in capacitance to cause an increase in current. There is a problem in that piezoelectric properties of the device are significantly impaired and therefore the distortion thereof is decreased when the temperature of the device approaches the Curie point. Furthermore, there is a problem in that the occurrence of phase transition causes the depolarization of the piezoelectric material which can prevent the device from functioning as a piezoelectric actuator when the temperature of the device exceeds the Curie point. In order to continuously operate the piezoelectric actuators, the piezoelectric materials need to have a small dielectric constant and a high Curie point in addition to having a large piezoelectric constant.

Patent Documents 1 and 2 disclose piezoelectric ceramic compositions in which PZT is doped with Pb(Ni$_{1/3}$Nb$_{2/3}$)O$_3$ (hereinafter referred to as "PNN") or Pb(Zn$_{1/3}$Nb$_{2/3}$)O$_3$ (hereinafter referred to as "PZN") in order to enhance these properties.

In particular, Patent Document 1 discloses a solid-solution piezoelectric ceramic composition containing four components: PNN, PNZ, PZ and PT. In order to achieve a large piezoelectric constant, a large electromechanical coefficient, a large dielectric constant, and a high Curie point, the amount of Pb is adjusted to be less than its stoichiometric composition.

Patent Document 2 discloses a piezoelectric ceramic composition having the composition formula aPbTiO$_3$-bPbZrO$_3$-cPb((Zn$_{1-x}$Ni$_x$)$_{2/3}$)O$_3$, wherein a, b and c are each located in a predetermined region in the ternary diagram thereof. In this composition, piezoelectric properties and continuous operation durability are balanced. Pb in this composition is partially replaced with at least one of Ba, Sr and Ca.

Patent Document 1: Japanese Unexamined Patent Application Publication No. 60-103079

Patent Document 2: Japanese Unexamined Patent Application Publication No. 2003-335579

DISCLOSURE OF THE INVENTION

Problems to be Solved by the Invention

In the invention disclosed in Patent Document 1, one sample in the examples had a Curie point of 285° C. and most of other samples had a Curie point of 140° C. to 265° C. The Curie points of these samples are insufficient. In particular, when a piezoelectric device operated at a high electric field of 1 kV/mm or more contains one of these samples, the piezoelectric properties of the piezoelectric device cannot be prevented from being impaired because the piezoelectric device generates a large amount of heat.

The amount of heat generated from the piezoelectric device is almost proportional to the electric field and frequency at which the piezoelectric device is operated; hence, it is difficult to use the piezoelectric device as a piezoelectric actuator for ink jet printer heads operated at an electric field of 1 kV/cm or more and a frequency of several kilohertz or more.

Furthermore, the samples of the invention disclosed in Patent Document 1 have a large dielectric constant ∈r of 3000 or more. This increases the amount of heat to impair piezoelectric properties. That is, the increase in dielectric constant increases the capacitance of the piezoelectric device to increase the current flowing in the piezoelectric device, thereby increasing the amount of heat generated from the piezoelectric device. This impairs piezoelectric properties of the piezoelectric device.

In the invention disclosed in Patent Document 2, a sample has a piezoelectric constant d$_{31}$ of 265 pm/V at most at a field intensity of 300 V/mm (see Table 1 in Patent Document 2). That is, this sample has an insufficient piezoelectric constant.

In order to manufacture a piezoelectric device, a piezoelectric material and internal electrodes are fired (co-fired) together in some cases. A piezoelectric material that has been fired with internal electrodes has a piezoelectric constant significantly less than that of a piezoelectric ceramic composition that has been fired alone.

The present invention has been made in view of the foregoing circumstances. It is an object of the present invention to provide a piezoelectric ceramic composition effective in achieving a large piezoelectric constant, a small dielectric constant and a high Curie point. It is another object of the present invention to provide a piezoelectric ceramic composition that can be prevented from having a reduced piezoelectric constant even if this piezoelectric ceramic composition is fired together with internal electrodes.

Means for Solving the Problems

In order to solve the above problems, a piezoelectric ceramic composition according to the present invention has the composition formula (Pb$_{(a-b)}$Me$_b$){(Ni$_{(1-c)/3}$Zn$_{c/3}$Nb$_{2d/3}$)$_z$Ti$_x$Zr$_{(1-x-z)}$}O$_3$, wherein Me represents at least one element selected from the group consisting of Ba, Sr and Ca; a, b, d, and x satisfy the inequalities $0.975 \leq a \leq 0.998$, $0 \leq b \leq 0.05$, $1 < d \leq 1.3$, and $0.39 \leq x \leq 0.47$; and c and z are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in the z-c plane as shown in FIG. 1.

A piezoelectric actuator according to the present invention includes a ceramic body containing the above piezoelectric ceramic composition and may further include internal electrodes in addition to the ceramic body. The internal electrodes preferably contain Ag.

Advantages

The piezoelectric ceramic composition of the present invention is effective in achieving a large piezoelectric constant, a small dielectric constant and a high Curie point and is suitable for piezoelectric actuators operated at high electric fields.

In particular, the piezoelectric ceramic composition has a piezoelectric constant $d_{33}$ of 550 pm/V or more, a dielectric constant ∈r of 3000 or less and a Curie point of 280° C. or more, that is, the piezoelectric ceramic composition has excellent piezoelectric properties.

If the present invention is applied to a monolithic piezoelectric actuator manufactured by co-firing a ceramic body and internal electrodes containing Ag, the piezoelectric constant of the piezoelectric actuator can be prevented from being reduced due to co-firing; hence, the piezoelectric actuator is suitable for practical use.

REFERENCE NUMERALS

Figure 1:
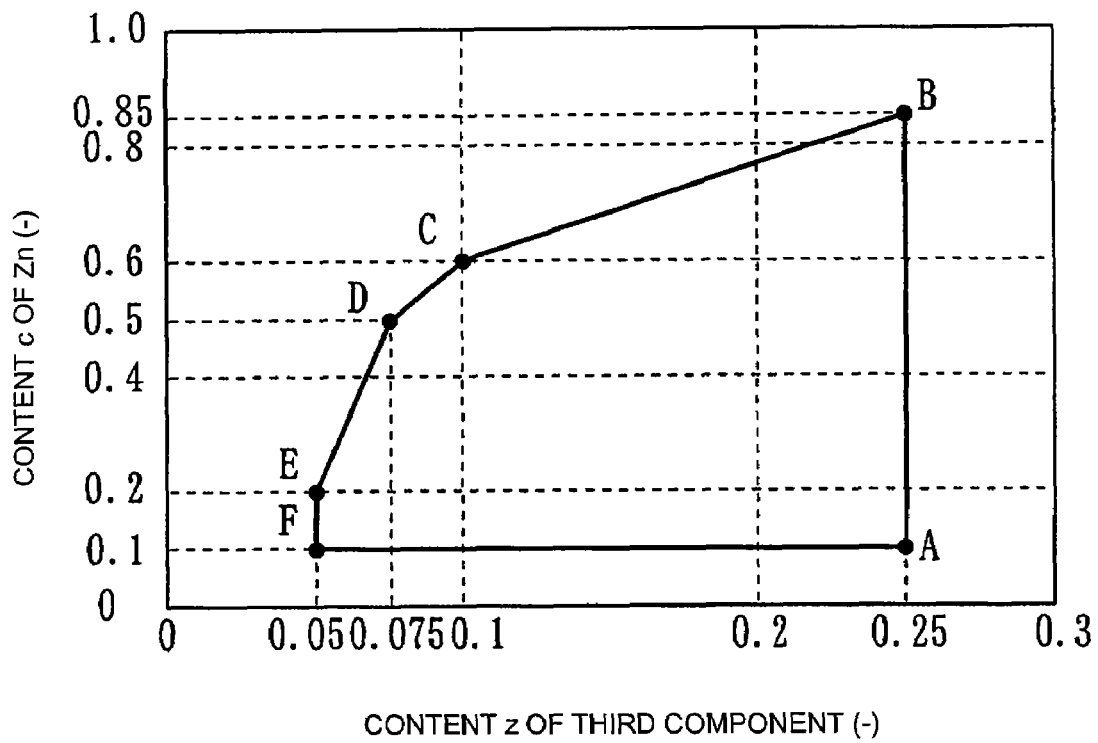
FIG. 1 is a graph showing the relationship between the molar ratio z of a third component in a piezoelectric ceramic composition according to the present invention and the molar ratio c of Zn to Ni in the third component.

10: ceramic body
21 and 22: internal electrodes
31 and 32: external electrodes

Best Mode for carrying out the Invention

The best mode for carrying out the present invention will now be described with reference to the attached drawings.

A piezoelectric ceramic composition according to the present invention is a complex oxide containing four components: PNN, PZN, PZ and PT, that is, Pb(Ni, Nb)O$_3$, Pb(Zn, Nb)O$_3$, PbZrO$_3$ and PbTiO$_3$. The piezoelectric ceramic composition has a perovskite crystal structure (general formula ABO$_3$) and is represented by the following composition formula:

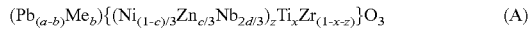

(Pb$_{(a-b)}$Me$_b$){(Ni$_{(1-c)/3}$Zn$_{c/3}$Nb$_{2d/3}$)$_z$Ti$_x$Zr$_{(1-x-z)}$}O$_3$  (A)

In the composition formula, Me represents at least one element selected from the group consisting of Ba, Sr and Ca and the molar amount a of an A site component containing Pb and Me, the molar amount (replacement rate) b of Me in the A site component, a molar amount d of Nb in a third component (Ni, Zn and Nb), and the molar amount x of Ti in a B site component satisfy the following inequalities:

$$0.975 \leq a \leq 0.998 \quad (1)$$

$$0 \leq b \leq 0.05 \quad (2)$$

$$1 < d \leq 1.3 \quad (3)$$

$$0.39 \leq x \leq 0.47 \quad (4)$$

Furthermore, the molar amount c of Zn in the sum of the content of Ni and the content of Zn (the molar amount being hereinafter simply referred to as "Zn molar amount") and the molar amount z of the third component (Ni, Zn, and Nb) are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in the z-c plane as shown in FIG. 1.

Since a, b, d and x in Formula (A) satisfy Inequalities (1) to (4) and the molar amount c and the molar amount z are located in the region, which is inequilateral hexagon ABCDEF, or located on the lines shown in FIG. 1, the piezoelectric ceramic composition has a large piezoelectric constant, a small dielectric constant and a high Curie point. Since the dielectric constant of the piezoelectric ceramic composition is small, a piezoelectric device made thereof generates a reduced amount of heat when the piezoelectric device is operated with a high voltage. Furthermore, since the Curie point of the piezoelectric ceramic composition is high, the temperature of the piezoelectric device can be suppressed to be less than the Curie point thereof even though heat is generated therefrom, thereby preventing the piezoelectric properties of the piezoelectric device from being impaired. Since the piezoelectric constant of the piezoelectric ceramic composition is large, the piezoelectric device has a large distortion. Even if the piezoelectric ceramic composition is fired together with internal electrodes containing Ag or the like, the piezoelectric constant of the piezoelectric ceramic composition can be prevented from being reduced.

The reasons why a, b, d and x are limited within the ranges defined by Inequalities (1) to (4) are as described below.

(1) a

When the molar amount a of the A site component, which principally contains Pb, in the piezoelectric ceramic composition, which contains PNN, PZN, PZ and PT, exceeds 0.998 to approach the stoichiometric composition, the piezoelectric ceramic composition has a reduced piezoelectric constant. This is probably because Pb(Ni, Nb)O$_3$—Pb(Zn, Nb)O$_3$, that is the third component, is not completely dissolved in Pb(Zr, Ti)O$_3$ and therefore an apparently excessive amount of the A site component segregates at grain boundaries. The approach of the molar amount a of the A site component to the stoichiometric composition promotes the synthesis and/or sintering reaction thereof. However, when the molar amount of the A site component exceeds 0.998 to approach the stoichiometric composition, the reaction thereof proceeds excessively in a pre-firing step and therefore the sintering properties thereof are impaired.

In contrast, the molar amount a of the A site component is less than 0.975, the sintering properties thereof are impaired and therefore the sintering temperature thereof is increased. Furthermore, the shift from the stoichiometric composition is excessively large and therefore heterogeneous phases are formed. This seriously impairs piezoelectric properties such as the piezoelectric constant.

According to the above reason, the piezoelectric ceramic composition of the present invention is prepared such that the molar amount a of the A site component satisfies the inequality $0.975 \leq a \leq 0.998$.

(2) b

The piezoelectric constant of the piezoelectric ceramic composition can be increased as required in such a manner that Pb in the A site component is partially replaced with Element Me (Ba, Ca or Sr). However, if the molar amount b of Element Me in the A site component exceeds 0.05, the Curie point may be reduced.

Thus, the molar amount b is adjusted to 0.05 or less.

(3) d

Since the molar amount d of Nb in the third component is one or more, the piezoelectric constant can be prevented from being reduced by firing the piezoelectric ceramic composition together with internal electrodes containing Ag. This can be analyzed as described below. In a Pb(Ti, Zr)O$_3$, which is a perovskite oxide having general formula ABO$_3$, bivalent Pb is located at the A site of its crystal structure and tetravalent Ti or Zr is located at the B site thereof, thereby balancing its charge. In PNN or PZN, one third of bivalent Ni or Zn and two thirds of pentavalent Nb occupy the B site. This allows the average valence thereof to be four to balance the charge of PNN or PZN. Since the internal electrodes contain Ag, Ag which is distributed in the piezoelectric ceramic composition by co-firing or simultaneous firing, probably occupies the A site. Since Ag is a monovalent element, the distribution of Ag reduces the average valence of the A site. This probably disrupts the charge balance to reduce the piezoelectric constant.

The molar amount of Nb, which is a pentavalent element, is adjusted to be greater than the stoichiometric composition. This probably compensates the charge reduction due to the distribution of Ag to prevent the reduction of the piezoelectric constant.

On the other hand, when the molar amount d exceeds 1.3, the sintering temperature is high and sintering properties are impaired.

Thus, the piezoelectric ceramic composition of the present invention is prepared such that the molar amount d of Nb in the third component satisfies the inequality $1 < d \leq 1.3$.

(4) x

In the piezoelectric ceramic composition, which contains PNN, PZN, PZ and PT, the molar amount x of Ti is adjusted such that the solid solution thereof is close to the MPB (morphotoropic phase boundary). This allows the piezoelectric ceramic composition to have a large piezoelectric constant.

From the above view point, the molar amount x is adjusted to satisfy the inequality $0.39 \leq x \leq 0.47$.

The molar amount c of Zn in the third component and the molar amount z of the third component (Ni, Zn and Nb) are adjusted to be located in the region, which is surrounded by the lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in the z-c plane as described above. This is because when the molar amounts c and z do not satisfy the above condition, a large piezoelectric constant and a high Curie point cannot be achieved together and abnormal grain growth may occur.

A monolithic piezoelectric actuator manufactured by the use of the piezoelectric ceramic composition will now be described.

Figure 2:
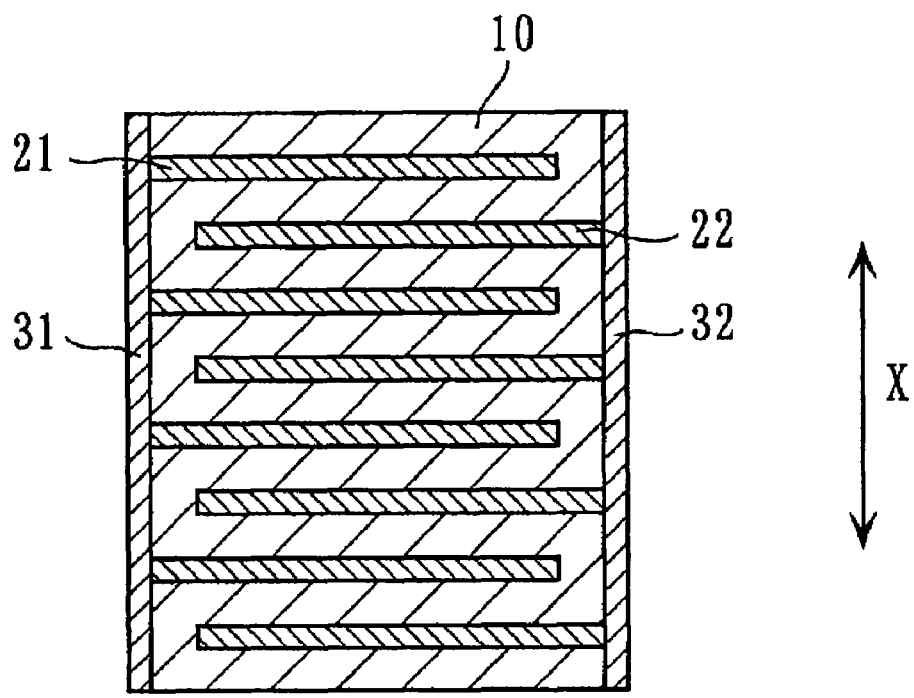
FIG. 2 is a sectional view of a piezoelectric actuator according to an embodiment of the present invention.

FIG. 2 is a sectional view of the piezoelectric actuator.

The piezoelectric actuator includes a ceramic body 10 containing the piezoelectric ceramic composition, internal electrodes 21 and 22 arranged in the ceramic body 10, and external electrodes 31 and 32 which are disposed on the ceramic body and which are electrically connected to the internal electrodes 21 and 22, respectively.

The piezoelectric actuator is distorted in the direction indicated by Arrow X in this figure, that is, in the thickness direction of the piezoelectric actuator by the piezoelectric effect in such a manner that a voltage is applied between the external electrodes 31 and 32.

A method for manufacturing the piezoelectric actuator will now be described.

Source powders of $Pb_3O_4$, $TiO_2$, $ZrO_2$, NiO, ZnO and $Nb_2O_5$ are weighed such that the molar amounts a, b, c, d, x, and y satisfy the above conditions. The source powders are wet-ground in a ball mill. $BaCO_3$, $CaCO_3$, $SrCO_3$ and/or the like may be added to the source powders as required. The resulting source powders preferably have an average particle size (D90) of 1 μm or less.

The powder mixture obtained is fired at a predetermined temperature of about 800° C. to 900° C., whereby a calcined powder is prepared. The calcined powder and an aqueous solution of a binder are mixed together in a pot mill, whereby slurry is obtained. The slurry is formed into ceramic green sheets by a known process such as a doctor blade process.

A conductive paste is prepared so as to contain Ag and Pd at a weight ratio of 7:3. Predetermined patterns for the internal electrodes are formed on some of the ceramic green sheets by a screen printing process. A material for forming the internal electrodes may contain Cu, Ni or the like.

A predetermined number of the ceramic green sheets having the internal electrode patterns are stacked. Unprinted ceramic green sheets having no internal electrode patterns are pressed against both sides of the stack, whereby a compact is prepared. The compact is cut into pieces having a predetermined size. The pieces are provided in an alumina sagger and then fired at a predetermined temperature of about 950° C. to 1200° C. in oxygen or air, whereby sintered bodies are obtained.

A conductive paste principally containing Ag is applied onto end faces of each sintered body and is then baked, whereby the external electrodes are formed. The sintered body is subjected to polarization at a field intensity of about 3 kV/mm, whereby the piezoelectric actuator is manufactured.

Since the piezoelectric actuator contains the piezoelectric ceramic composition, the piezoelectric actuator has a large piezoelectric constant and can be significantly distorted. Since the dielectric constant is small and the Curie point is high, the temperature of the actuator does not approach or exceed its Curie point even if the actuator is continuously operated at a high electric field; hence, the piezoelectric properties thereof can be prevented from being impaired. Although the piezoelectric ceramic composition and the internal electrodes, which contain Ag, are co-fired, the piezoelectric properties thereof can be prevented from being impaired.

The above embodiment is only for exemplification and should not be construed as limitative. In the embodiment, oxide powders are used. Instead, carbonate or hydroxide powders may be used as long as the piezoelectric ceramic composition has the above composition formula.

The piezoelectric ceramic composition may further contain a trace amount of impurities if the piezoelectric properties thereof are not impaired. For example, a trace amount of $HfO_2$ can be present in the $ZrO_2$ source powder and a trace amount of $Ta_2O_5$ can be present in the $Nb_2O_5$ source powder.

In the embodiment, the piezoelectric actuator is a multilayer type. The piezoelectric actuator may be a single-layer type. The applications of the piezoelectric ceramic composition is not limited to a piezoelectric actuator. The piezoelectric ceramic composition may be used for piezoelectric buzzers.

The present invention will be further described in detail with reference to examples.

EXAMPLE 1

$Pb_3O_4$, $BaCO_3$, $CaCO_3$, $SrCO_3$, NiO, ZnO, $Nb_2O_5$, $TiO_2$ and $ZrO_2$ that were ceramic sources were weighed such that piezoelectric ceramic compositions finally had composition formulas shown in Tables 1 and 2. The ceramic sources and pure water were fed into a pot mill and were then mixed together for 16 hours. The source mixtures were calcined at 880° C., whereby calcined powders (piezoelectric ceramic compositions) were obtained. Each fired powder was mixed with an organic binder and pure water. This mixture was kneaded for 16 hours in a pot mill, whereby a ceramic slurry was obtained.

The ceramic slurry was formed into ceramic green sheets by a doctor blade process.

A predetermined number of the untreated ceramic green sheets were stacked, debindered at 360° C. for two hours, and then fired at 1050° C. for five hours in oxygen, whereby a sintered body was obtained.

A layer of Cu was provided on both end faces of the sintered body by vapor deposition and a layer of Ag was provided on the Cu layer by vapor deposition, whereby external electrodes, having a two-layer structure, containing Cu and Ag were formed. The sintered body was subjected to polarization at a field density of 3 kV/mm in 80° C. oil. Bulk samples for Samples 1 to 53 were prepared as described above.

Monolithic piezoelectric actuators were then manufactured using the ceramic green sheets.

After the ceramic green sheets were prepared, internal electrodes were formed on the ceramic green sheets by a screen printing process using a conductive paste containing a conductive material containing Ag and Pd. The weight ratio of Ag to Pd in the conductive material was 7:3. A predetermined number of these ceramic green sheets were stacked. Unprinted ceramic green sheets having no internal electrodes were pressed against both sides of each stack, whereby compacts were prepared.

Each compact was cut into pieces having a predetermined size. These pieces were provided in an alumina sagger, degreased at 360° C. for two hours, and then fired at 1000° C. for five hours in oxygen, whereby sintered bodies are obtained.

A conductive paste was applied onto both end faces of each sintered body and was then baked, whereby external electrodes are formed. The sintered bodies were subjected to polarization at a field intensity of 3 kV/mm in 80° C. oil. The piezoelectric actuators for Samples 1 to 53 were prepared as described above.

The bulk samples were measured for piezoelectric constant $d_{33}$, dielectric constant $\epsilon r$ and Curie point Tc.

The piezoelectric constant $d_{33}$ of each sample was determined as follows: the sample was measured for distortion factor in the thickness direction with an inductive probe and a differential transformer by applying an electric field of 2 kV/mm to the sample in the form of a 0.1 Hz triangular wave and the distortion factor thereof was divided by the electric field.

The dielectric constant $\epsilon r$ thereof was measured at a frequency of 1 kHz with an RF impedance analyzer (HP 4294A, Hewlett-Packard).

Furthermore, the temperature characteristic of the dielectric constant $\epsilon r$ was measured. The temperature at which the dielectric constant $\epsilon r$ peaked was defined as the Curie point Tc.

The piezoelectric actuators, as well as the bulk samples, were measured for electric constant $d_{33}'$. The reduction rate of the piezoelectric constant, $\Delta d_{33}$, (hereinafter simply referred to as "reduction rate") was determined from the following equation:

$$\Delta d_{33} = \{(d_{33} - d_{33}')/d_{33}\} \times 100 \tag{5}$$

Tables 1 and 2 show the compositions and measurements of Samples 1 to 53.

TABLE 1

| | $(Pb_{(a-b)}Me_b)\{Ni_{(1-c)/3}Zn_{c/3}Nb_{2d/3})_zTi_xZr_{(1-x-z)}\}O_3$ | | | | | | Piezoelectric constant $d_{33}$ (pm/V) | Dielectric constant $\epsilon r$ (—) | Curie point Tc (° C.) | Reduction rate $\Delta d_{33}$ (%) |
|---|---|---|---|---|---|---|---|---|---|---|
| Samples | a | b | c | d | x | z | | | | |
| 1* | 1.000 | 0 | 0.50 | 1.020 | 0.410 | 0.200 | 450 | 1260 | 310 | 3 |
| 2 | 0.998 | 0 | 0.50 | 1.020 | 0.410 | 0.200 | 620 | 2130 | 310 | 8 |
| 3 | 0.995 | 0 | 0.50 | 1.020 | 0.410 | 0.200 | 760 | 2410 | 310 | 4 |
| 4 | 0.990 | 0 | 0.50 | 1.020 | 0.410 | 0.200 | 850 | 2810 | 310 | 8 |
| 5 | 0.985 | 0 | 0.50 | 1.020 | 0.410 | 0.200 | 820 | 2700 | 310 | −1 |
| 6 | 0.980 | 0 | 0.50 | 1.020 | 0.410 | 0.200 | 790 | 2620 | 310 | 7 |
| 7 | 0.975 | 0 | 0.50 | 1.020 | 0.410 | 0.200 | 670 | 2300 | 310 | 12 |
| 8* | 0.970 | 0 | 0.50 | 1.020 | 0.410 | 0.200 | — | — | — | — |
| 9 | 0.995 | 0 | 0.50 | 1.100 | 0.440 | 0.100 | 840 | 2510 | 340 | 8 |
| 10 | 0.995 | 0.025 (Ba) | 0.50 | 1.100 | 0.440 | 0.100 | 810 | 2300 | 320 | 10 |
| 11 | 0.995 | 0.050 (Ba) | 0.50 | 1.100 | 0.440 | 0.100 | 830 | 2390 | 290 | 11 |
| 12* | 0.995 | 0.075 (Ba) | 0.50 | 1.100 | 0.440 | 0.100 | 840 | 2430 | 270 | 7 |
| 13 | 0.995 | 0.025 (Sr) | 0.50 | 1.100 | 0.445 | 0.100 | 800 | 2330 | 320 | 7 |
| 14 | 0.995 | 0.025 (Ca) | 0.50 | 1.100 | 0.445 | 0.100 | 720 | 2110 | 320 | 8 |
| 15* | 0.990 | 0 | 0.50 | 1.020 | 0.380 | 0.200 | 480 | 1550 | 290 | −2 |
| 16 | 0.990 | 0 | 0.50 | 1.020 | 0.390 | 0.200 | 550 | 2020 | 290 | 0 |
| 17 | 0.990 | 0 | 0.50 | 1.020 | 0.400 | 0.200 | 720 | 2480 | 300 | 9 |
| 18 | 0.990 | 0 | 0.50 | 1.020 | 0.420 | 0.200 | 760 | 2610 | 310 | 5 |
| 19 | 0.990 | 0 | 0.50 | 1.020 | 0.430 | 0.200 | 680 | 2460 | 320 | 0 |
| 20 | 0.990 | 0 | 0.50 | 1.020 | 0.440 | 0.200 | 610 | 2030 | 320 | 4 |
| 21 | 0.995 | 0 | 0.50 | 1.100 | 0.435 | 0.100 | 730 | 2120 | 340 | 15 |
| 22 | 0.995 | 0 | 0.50 | 1.100 | 0.450 | 0.100 | 750 | 2370 | 340 | 14 |
| 23 | 0.995 | 0 | 0.50 | 1.100 | 0.460 | 0.100 | 650 | 2120 | 350 | 17 |

TABLE 1-continued

| | (Pb$_{(a-b)}$Me$_b$){Ni$_{(1-c)/3}$Zn$_{c/3}$Nb$_{2/3}$)$_d$Ti$_x$Zr$_{(1-x-z)}$}O$_3$ | | | | | Piezoelectric constant d$_{33}$ | Dielectric constant ∈r | Curie point Tc | Reduction rate Δd$_{33}$ |
|---|---|---|---|---|---|---|---|---|---|
| Samples | a | b | c | d | x | z | (pm/V) | (−) | (° C.) | (%) |
| 24 | 0.995 | 0 | 0.50 | 1.100 | 0.470 | 0.100 | 590 | 1880 | 350 | 13 |
| 25* | 0.995 | 0 | 0.50 | 1.100 | 0.480 | 0.100 | 480 | 1560 | 360 | 15 |

Samples with an asterisk are outside the scope of the present invention.

TABLE 2

| | (Pb$_{(a-b)}$Me$_b$){Ni$_{(1-c)/3}$Zn$_{c/3}$Nb$_{2/3}$)$_d$Ti$_x$Zr$_{(1-x-z)}$}O$_3$ | | | | | Piezoelectric constant d$_{33}$ | Dielectric constant ∈r | Curie point Tc | Reduction rate Δd$_{33}$ |
|---|---|---|---|---|---|---|---|---|---|
| Samples | a | b | c | d | x | z | (pm/V) | (−) | (° C.) | (%) |
| 26* | 0.990 | 0 | 0.00 | 1.200 | 0.400 | 0.250 | 820 | 2810 | 270 | 15 |
| 27 | 0.990 | 0 | 0.10 | 1.200 | 0.398 | 0.250 | 840 | 2910 | 280 | 5 |
| 28 | 0.990 | 0 | 0.25 | 1.200 | 0.398 | 0.250 | 800 | 2730 | 280 | 8 |
| 29 | 0.990 | 0 | 0.50 | 1.200 | 0.390 | 0.250 | 820 | 2880 | 290 | −7 |
| 30 | 0.990 | 0 | 0.75 | 1.200 | 0.383 | 0.250 | 800 | 2700 | 300 | 7 |
| 31 | 0.990 | 0 | 0.85 | 1.200 | 0.380 | 0.250 | 770 | 2650 | 310 | 0 |
| 32* | 0.990 | 0 | 0.90 | 1.200 | 0.370 | 0.250 | 530 | 1710 | 310 | 8 |
| 33* | 0.990 | 0 | 0.00 | 1.020 | 0.420 | 0.200 | 870 | 3030 | 280 | 19 |
| 34 | 0.990 | 0 | 0.10 | 1.020 | 0.418 | 0.200 | 840 | 2910 | 290 | 10 |
| 35 | 0.990 | 0 | 0.25 | 1.020 | 0.418 | 0.200 | 820 | 2730 | 290 | 11 |
| 36 | 0.990 | 0 | 0.75 | 1.020 | 0.403 | 0.200 | 800 | 2730 | 310 | 8 |
| 37* | 0.990 | 0 | 0.90 | 1.020 | 0.400 | 0.200 | 470 | 1480 | 320 | 9 |
| 38* | 0.995 | 0 | 0.00 | 1.100 | 0.450 | 0.100 | 790 | 2390 | 310 | 12 |
| 39 | 0.995 | 0 | 0.10 | 1.100 | 0.448 | 0.100 | 850 | 2610 | 320 | 7 |
| 40 | 0.995 | 0 | 0.25 | 1.100 | 0.448 | 0.100 | 820 | 2430 | 320 | 10 |
| 41 | 0.995 | 0 | 0.60 | 1.100 | 0.438 | 0.100 | 830 | 2430 | 340 | 10 |
| 42* | 0.995 | 0 | 0.75 | 1.100 | 0.430 | 0.100 | 530 | 1380 | 350 | 5 |
| 43* | 0.995 | 0 | 0.00 | 1.100 | 0.448 | 0.075 | 760 | 2290 | 320 | 18 |
| 44 | 0.995 | 0 | 0.10 | 1.100 | 0.450 | 0.075 | 820 | 2440 | 330 | 7 |
| 45 | 0.995 | 0 | 0.25 | 1.100 | 0.450 | 0.075 | 850 | 2570 | 330 | 9 |
| 46 | 0.995 | 0 | 0.50 | 1.100 | 0.458 | 0.075 | 780 | 2290 | 350 | 6 |
| 47* | 0.995 | 0 | 0.75 | 1.100 | 0.460 | 0.075 | 510 | 1550 | 360 | 8 |
| 48* | 0.995 | 0 | 0.00 | 1.100 | 0.445 | 0.050 | 660 | 1890 | 330 | 17 |
| 49 | 0.995 | 0 | 0.10 | 1.100 | 0.445 | 0.050 | 780 | 2230 | 340 | 10 |
| 50 | 0.995 | 0 | 0.20 | 1.100 | 0.448 | 0.050 | 760 | 2260 | 340 | 8 |
| 51* | 0.995 | 0 | 0.25 | 1.100 | 0.450 | 0.050 | 520 | 1330 | 350 | 6 |
| 52* | 0.995 | 0 | 0.20 | 1.100 | 0.450 | 0.025 | 530 | 1410 | 360 | 14 |
| 53* | 0.995 | 0 | 0.50 | 1.020 | 0.380 | 0.300 | 830 | 2980 | 260 | −3 |

Samples with an asterisk are outside the scope of the present invention.

In Samples 1 to 8, the molar amounts b, c, d, x and z of the piezoelectric ceramic compositions are within the scope of the present invention and the molar amount a of Pb that is an A site component is varied.

In Sample 1, the molar amount a of the A site component is 1.00 and the piezoelectric constant d$_{33}$ is 450 pm/V, that is, the molar amount a is large and therefore the piezoelectric constant d$_{33}$ is small.

In Sample 8, the molar amount a of the A site component is 0.970, that is, the molar amount a is excessively small and is seriously different from the stoichiometric composition. Hence, sintering properties are insufficient and therefore no sintered body was obtained under the following conditions: a firing temperature of 1050° C. and a firing time of five hours. Thus, no piezoelectric properties (piezoelectric constant d$_{33}$, dielectric constant ∈r, and Curie point Tc) were obtained.

In Samples 2 to 7, the molar amount a of the A site component satisfies the inequality 0.975≦a≦0.998, that is, the molar amount a is within the scope of the present invention. Hence, the sintered bodies were obtained under the following conditions: a firing temperature of 1050° C. and a firing time of five hours. The piezoelectric constant d$_{33}$ ranges from 620 to 850 pm/V, that is, the piezoelectric constant d$_{33}$ can be controlled to be 550 pm/V or more. The dielectric constant ∈r ranges from 2130 to 2810, that is, the dielectric constant ∈r can be controlled to be 3000 or less. The Curie point Tc is 310° C., that is, the Curie point Tc can be controlled to be 280° C. or higher.

In Samples 9 to 14, the molar amounts a, c, d, x and z of the piezoelectric ceramic compositions are within the scope of the present invention and the molar amount b (replacement rate) of Me (Ba, Sr or Ca) in the A site is varied.

In Sample 12, the molar amount b of Ba in the A site is 0.075 and the Curie point Tc is 270° C., that is, the molar amount b is large and therefore the Curie point Tc is low.

In Samples 9 to 11, 13, and 14, the molar amount b satisfies the inequality 0≦b≦0.050, that is, the molar amount b is within the scope of the present invention. The piezoelectric constant d$_{33}$ ranges from 720 to 840 pm/V, that is, the piezoelectric constant d$_{33}$ can be controlled to be 550 pm/V or more. The dielectric constant ∈r ranges from 2110 to 2510, that is, the dielectric constant ∈r can be controlled to be 3000 or less. The Curie point Tc ranges from 290° C. to 340° C., that is, the Curie point Tc can be controlled to be 280° C. or higher.

In Samples 15 to 25, the molar amounts a, b, c, d and z of the piezoelectric ceramic compositions are within the scope of the present invention and the molar amount x of Ti in the B site is varied.

In Sample 15, the molar amount x of Ti is 0.380 and the piezoelectric constant $d_{33}$ is 480 pm/V, that is, the molar amount x is small. Therefore the composition of a solid solution is not close to the MPB. Hence, the piezoelectric constant $d_{33}$ is small.

In Sample 25 as well as Sample 15, the molar amount x of Ti is 0.480 and the piezoelectric constant $d_{33}$ is 480 pm/V, that is, the molar amount x is large. Therefore the composition of a solid solution is not close to the MPB. Hence, the piezoelectric constant $d_{33}$ is small.

In Samples 16 to 24, the molar amount x satisfies the inequality $0.39 \leq x \leq 0.47$, that is, the molar amount x is within the scope of the present invention. The piezoelectric constant $d_{33}$ ranges from 550 to 760 pm/V, that is, the piezoelectric constant $d_{33}$ can be controlled to be 550 pm/V or more. The dielectric constant $\in r$ ranges from 1880 to 2610, that is, the dielectric constant $\in r$ can be controlled to be 3000 or less. The Curie point Tc ranges from 290° C. to 350° C., that is, the Curie point Tc can be controlled to be 280° C. or higher.

In Samples 26 to 53 (Table 2), the molar amounts a, b, d and x of the piezoelectric ceramic compositions are within the scope of the present invention and the molar amount c of Zn and the molar amount z of a third component are varied in combination.

In Sample 26, the molar amount c is 0.00 and the molar amount z is 0.250, that is, the combination of the molar amount c and the molar amount z is located outside Hexagon ABCDEF shown in FIG. 1 and therefore is outside the scope of the present invention. Hence, the Curie point Tc is 270° C., that is, the Curie point Tc is low. Furthermore, abnormal grain growth is observed.

In Sample 32, the molar amount c is 0.90 and the molar amount z is 0.250, that is, the combination of the molar amount c and the molar amount z is outside the scope of the present invention. Hence, the piezoelectric constant $d_{33}$ is 530 pm/V, that is, the piezoelectric constant $d_{33}$ is small.

In Sample 33, the molar amount c is 0.00 and the molar amount z is 0.200, that is, the combination of the molar amount c and the molar amount z is outside the scope of the present invention. Hence, the dielectric constant $\in r$ exceeds 3000 and abnormal grain growth is observed.

In Sample 37, the molar amount c is 0.90 and the molar amount z is 0.200, that is, the combination of the molar amount c and the molar amount z is outside the scope of the present invention. Hence, the piezoelectric constant $d_{33}$ is 470 pm/V, that is, the piezoelectric constant $d_{33}$ is small.

In Sample 38, the molar amount c is 0.00 and the molar amount z is 0.100, that is, a combination of the molar amount c and the molar amount z is outside the scope of the present invention. Hence, abnormal grain growth is observed.

In Sample 42, the molar amount c is 0.75 and the molar amount z is 0.100, that is, the combination of the molar amount c and the molar amount z is outside the scope of the present invention. Hence, the piezoelectric constant $d_{33}$ is 530 pm/V, that is, the piezoelectric constant $d_{33}$ is small.

In Sample 43, the molar amount c is 0.00 and the molar amount z is 0.075, that is, the combination of the molar amount c and the molar amount z is outside the scope of the present invention. Hence, abnormal grain growth is observed.

In Sample 47, the molar amount c is 0.75 and the molar amount z is 0.075, that is, the combination of the molar amount c and the molar amount z is outside the scope of the present invention. Hence, the piezoelectric constant $d_{33}$ is 510 pm/V, that is, the piezoelectric constant $d_{33}$ is small.

In Sample 48, the molar amount c is 0.00 and the molar amount z is 0.050, that is, the combination of the molar amount c and the molar amount z is outside the scope of the present invention. Hence, abnormal grain growth is observed.

In Sample 51, the molar amount c is 0.25 and the molar amount z is 0.050, that is, the combination of the molar amount c and the molar amount z is outside the scope of the present invention. Hence, the piezoelectric constant $d_{33}$ is 510 pm/V, that is, the piezoelectric constant $d_{33}$ is small.

In Sample 52, the molar amount c is 0.200 and the molar amount z is 0.025, that is, the combination of the molar amount c and the molar amount z is outside the scope of the present invention. Hence, the piezoelectric constant $d_{33}$ is 530 pm/V, that is, the piezoelectric constant $d_{33}$ is small.

In Sample 53, the molar amount c is 0.50 and the molar amount z is 0.300, that is, the combination of the molar amount c and the molar amount z is outside the scope of the present invention. Hence, the Curie point Tc is 260° C., that is, the Curie point Tc is low.

In Samples 27 to 31, 34 to 36, 39 to 41, 44 to 46, 49 and 50, the combination of the molar amount c and the molar amount z is within the scope of the present invention. Hence, the piezoelectric constant $d_{33}$ is 550 pm/V or more, the dielectric constant $\in r$ is less than 3000, and the Curie point Tc is 280° C. or higher. This shows that a piezoelectric ceramic composition having a large piezoelectric constant $d_{33}$, a small dielectric constant $\in r$, and a high Curie point Tc can be achieved.

EXAMPLE 2

$Pb_3O_4$, NiO, ZnO, $Nb_2O_5$, $TiO_2$ and $ZrO_2$ that were ceramic sources were weighed such that piezoelectric ceramic compositions finally had composition formulas shown in Table 3. Bulk samples and monolithic piezoelectric actuators for Samples 61 to 70 were then prepared by a method or procedure similar to that described in Example 1.

The bulk samples were measured for piezoelectric constant $d_{33}$, dielectric constant $\in r$ and Curie point Tc and the piezoelectric actuators were measured for piezoelectric constant $d_{33}'$ by a method or procedure similar to that described in Example 1. The reduction rate $\Delta d_{33}$ was determined from Equation (5) described above.

Table 3 shows the compositions and measurements of Samples 61 to 70.

TABLE 3

| | (Pb$_{(a-b)}$Me$_b$){(Ni$_{(1-c)/3}$Zn$_{c/3}$Nb$_{2d/3}$)$_z$Ti$_x$Zr$_{(1-x-z)}$}O$_3$ | | | | | | Piezoelectric constant d$_{33}$ | Dielectric constant εr | Curie point Tc | Reduction rate Δd$_{33}$ |
|---|---|---|---|---|---|---|---|---|---|---|
| Samples | a | b | c | d | X | z | (pm/V) | (−) | (° C.) | (%) |
| 61* | 0.990 | 0 | 0.50 | 1.000 | 0.410 | 0.200 | 830 | 2800 | 310 | 17 |
| 62 | 0.990 | 0 | 0.50 | 1.005 | 0.410 | 0.200 | 820 | 2730 | 310 | 6 |
| 63 | 0.990 | 0 | 0.50 | 1.010 | 0.410 | 0.200 | 830 | 2780 | 310 | 8 |
| 64 | 0.990 | 0 | 0.50 | 1.050 | 0.410 | 0.200 | 810 | 2680 | 300 | 6 |
| 65* | 0.995 | 0 | 0.50 | 1.000 | 0.440 | 0.100 | 790 | 2280 | 340 | 59 |
| 66 | 0.995 | 0 | 0.50 | 1.050 | 0.440 | 0.100 | 810 | 2350 | 340 | 30 |
| 67 | 0.995 | 0 | 0.50 | 1.150 | 0.440 | 0.100 | 820 | 2380 | 340 | −2 |
| 68 | 0.995 | 0 | 0.50 | 1.200 | 0.440 | 0.100 | 750 | 2280 | 330 | −6 |
| 69 | 0.995 | 0 | 0.50 | 1.300 | 0.440 | 0.100 | 660 | 1890 | 330 | −11 |
| 70* | 0.995 | 0 | 0.50 | 1.400 | 0.440 | 0.100 | — | — | — | — |

Samples with an asterisk are outside the scope of the present invention.

In Samples 61 to 64, the molar amounts a, b, c, x and z of the piezoelectric ceramic compositions are constant and are within the scope of the present invention and the molar amount d of Nb in a third component is varied.

Comparisons among Samples 61 to 64 are as described below. In Sample 61, the molar amount d is 1.000 and the reduction rate Δd$_{33}$ is 17%. In Samples 62 to 64, the molar amount d exceeds 1.000 and the reduction rate Δd$_{33}$ ranges from 6% to 8%, that is, the reduction rate Δd$_{33}$ is small. This shows that the reduction rate Δd$_{33}$ of the piezoelectric constant can be greatly reduced by controlling the molar amount d to be greater than the stoichiometric composition even if the internal electrodes and ceramic bodies are co-fired.

In Samples 65 to 70, the molar amounts a, b, c, x and z of the piezoelectric ceramic compositions are constant and are within the scope of the present invention and the molar amount d of Nb in the third component is varied.

Comparisons among Samples 65 to 70 are as described below. In Sample 65, the molar amount d is 1.000 and the reduction rate Δd$_{33}$ is 59%; hence, the piezoelectric actuator has a piezoelectric constant significantly less than that of the bulk sample. In Samples 66 to 69, the molar amount d exceeds 1.000 and the reduction rate Δd$_{33}$ is small. In particular, in Samples 67 to 69, the piezoelectric constant d$_{33}$ is high.

Sample 70 shows that the molar amount d of Nb is 1.400, that is, the molar amount d is large and therefore sintering properties are insufficient. Hence, no sintered body was obtained under the following conditions: a firing temperature of 1050° C. and a firing time of five hours.

As is clear from the above results, a reduction in piezoelectric constant can be reduced by allowing the molar amount d of Nb to slightly exceed the stoichiometric composition, in monolithic piezoelectric actuators manufactured by co-firing the ceramic bodies and the internal electrodes. However, when the molar amount d of Nb exceeds 1.300, sintering properties are insufficient; hence, any sintered bodies cannot be manufactured under the following conditions: a firing temperature of 1050° C. and a firing time of five hours.

The invention claimed is:

1. A piezoelectric ceramic composition having the composition formula (Pb$_{(a-b)}$Me$_b$){(Ni$_{(1-c)/3}$Zn$_{c/3}$Nb$_{2d/3}$)$_z$Ti$_x$Zr$_{(1-x-z)}$}O$_3$ wherein Me represents at least one element selected from the group consisting of Ba, Sr and Ca.

$0.975 \leq a \leq 0.998$ $0 \leq b \leq 0.05$ $1 < d \leq 1.3$ and $0.39 \leq x \leq 0.47$ and wherein c and z are located in a region surrounded by lines connecting Point A (z=0.25, c=0.1), Point B (z=0.25, c=0.85), Point C (z=0.1, c=0.6), Point D (z=0.075, c=0.5), Point E (z=0.05, c=0.2), and Point F (z=0.05, c=0.1) or located on the lines in a graph of z and c.

2. The piezoelectric ceramic composition according to claim 1, wherein Me is one member of said group.

3. The piezoelectric ceramic composition according to claim 1, wherein b is 0, d is at least 1.005, c is 0.1 to 0.75, and z is 0.05 to 0.25.

4. A piezoelectric actuator comprising a ceramic body containing the piezoelectric ceramic composition according to claim 3.

5. The piezoelectric actuator according to claim 4, further comprising internal electrodes embedded in the ceramic body.

6. The piezoelectric actuator according to claim 5, wherein the internal electrodes comprise Ag.

7. A piezoelectric actuator comprising a ceramic body containing the piezoelectric ceramic composition according to claim 2.

8. The piezoelectric actuator according to claim 7, further comprising internal electrodes embedded in the ceramic body.

9. The piezoelectric actuator according to claim 8, wherein the internal electrodes comprise Ag.

10. A piezoelectric actuator comprising a ceramic body containing the piezoelectric ceramic composition according to claim 1.

11. The piezoelectric actuator according to claim 10, further comprising internal electrodes embedded in the ceramic body.

12. The piezoelectric actuator according to claim 11, wherein the internal electrodes comprise Ag.

* * * * *